United States Patent
Braeckelmann et al.

(10) Patent No.: US 8,264,060 B2
(45) Date of Patent: Sep. 11, 2012

(54) METHOD OF SEALING AN AIR GAP IN A LAYER OF A SEMICONDUCTOR STRUCTURE AND SEMICONDUCTOR STRUCTURE

(75) Inventors: Greg Braeckelmann, Holzkirchen (DE); Marius Orlowski, Meylan (FR); Andreas Wild, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/300,953

(22) Filed: Nov. 21, 2011

(65) Prior Publication Data

US 2012/0126413 A1     May 24, 2012

Related U.S. Application Data

(63) Continuation of application No. 12/936,113, filed as application No. PCT/IP2008/053133 on Apr. 17, 2008, now Pat. No. 8,071,459.

(51) Int. Cl.
*H01L 21/00* (2006.01)
(52) U.S. Cl. ............... 257/522; 438/319; 438/411
(58) Field of Classification Search ............ 257/522; 438/319, 411
See application file for complete search history.

(56) References Cited

U.S. PATENT DOCUMENTS

| | | | |
|---|---|---|---|
| 5,759,913 A | 6/1998 | Fulford, Jr. et al. | |
| 6,057,226 A | 5/2000 | Wong | |
| 6,184,121 B1 | 2/2001 | Buchwalter et al. | |
| 6,200,900 B1 | 3/2001 | Kitch | |
| 6,211,561 B1 | 4/2001 | Zhao | |
| 6,297,125 B1 | 10/2001 | Nag et al. | |
| 6,413,852 B1 | 7/2002 | Grill et al. | |
| 7,005,371 B2 | 2/2006 | Chinthakindi et al. | |
| 7,078,352 B2 | 7/2006 | Beyer et al. | |
| 7,449,407 B2 | 11/2008 | Lur et al. | |
| 2003/0042612 A1 | 3/2003 | Leuschner et al. | |
| 2006/0255432 A1 | 11/2006 | Meagley et al. | |
| 2006/0258077 A1 | 11/2006 | Kunnen | |
| 2007/0102821 A1 | 5/2007 | Papa Rao et al. | |

FOREIGN PATENT DOCUMENTS

EP     0834916 A     4/1998

OTHER PUBLICATIONS

Uno S. et al: "Dual Damascene Process for Air-Gap Cu Interconnects Using Conventional CVD Films as Sacrificial Layers" IEEE, 2005, Japan, pp. 174-176.
International Technology Roadmap for Semiconductors (ITRS), Interconnect Chapter, 2007, website: http://www.itrs.net/links/2007itrs/home2007.htm<>>, 67 pages.
International Search Report and Written Opinion received for International Application No. PCT/IB2008/053133, dated Jan. 21, 2009, 7 pages.

(Continued)

*Primary Examiner* — Jarrett Stark
*Assistant Examiner* — Nicholas Tobergte

(57) ABSTRACT

Providing a first layer of a semiconductor structure having at least one air gap between conductive lines formed in the first layer. The air gap extends into the first layer from a first surface of the first layer. A barrier dielectric material over the first surface and the air gap is selected to have a dielectric constant less than 3.5 and to provide a barrier to prevent chemicals entering the at least one air gap. An air gap can extend from a first surface of the first layer to at least a portion of side surfaces of the at least two conductive lines to expose at least a portion of the side surfaces.

20 Claims, 3 Drawing Sheets

OTHER PUBLICATIONS

Gras, R. et al, "300mm Multi Level Air Gap Integration for Edge Interconnect Technologies and Specific High Performance Applications", 2008 Interconnect Technology Conference, Jun. 2008, Burlingame, CA, USA, pp. 196-198, IEEE ISBN 978-1-4244-1911-1.

Lee, Young Chui, "Novel Low-Toss LTCC Microstrip Lines with Air-Cavities Embedded in the LTCC Substrate", 2003 Asia-Pacific Microwave Conference, Nov. 2003, Seoul, Korea, 4 pages.

Spencer, Todd J., "Air-Gap Transmission Lines on Organic Substrates for Low-Loss Interconnects", IEEE Transactions on Microwave Theory and Techniques, vol. 55, No. 9, Sep. 2007, pp. 1919-1925, IEEE ISSN 0018-9480.

Chen, Chung-Hui et al., "A Deep Submicron CMOS Process Compatible Suspending High-Q Inductor", IEEE Electron Device Letters, vol. 22, No. 11, Nov. 2001, pp. 522-523, IEEE ISSN 0741-3106.

METHOD OF SEALING AN AIR GAP IN A LAYER OF A SEMICONDUCTOR STRUCTURE AND SEMICONDUCTOR STRUCTURE

CROSS-REFERENCE TO RELATED APPLICATION(S)

This application is a continuation of U.S. patent application Ser. No. 12/936,113, entitled "Method of Sealing an Air Gap in a Layer of a Semiconductor Structure and Semiconductor Structure," filed on Oct. 1, 2010, which is a National Stage Entry under 37 C.F.R. §371 of PCT/IB2008/053133, filed Apr. 17, 2008, the disclosures of which are hereby expressly incorporated by reference in their entirety.

FIELD OF THE DISCLOSURE

This disclosure relates to a method of sealing an air gap in a layer of a semiconductor structure and to a semiconductor structure.

BACKGROUND

In manufacturing a semiconductor device or an Integrated Circuit (IC) (more specifically during Back End processing), fine interconnect lines, typically made of metal such as copper, are used to provide connections to the device areas in the semiconductor device or IC and one or more interlayer dielectric (ILD) layers are used to provide isolation between the interconnect lines. The ILD material and interconnect lines act as a capacitor which slows down the propagation of signals through the interconnect lines. Thus, the dielectric constants k of the ILD layers, together with the resistance of the interconnect lines, affect the speed of signal propagation in an IC. In order to improve the speed of signal propagation, dielectric materials with low dielectric constants k are used for the ILD layers.

In the search for materials having the lowest dielectric constants and since air has the lowest relative dielectric constant of close to 1, techniques have been developed whereby air gaps or void space in the ILD layers are used to reduce interconnect capacitance and so improve the speed of signal propagation. The lowest dielectric constant can be achieved with air gaps of mesoscopic dimensions.

The formation of air gaps in ILD layers is well known. For example, U.S. Pat. No. 6,297,125 discloses a method of forming air gaps between two laterally spaced metal lines. U.S. Pat. No. 7,078,352 describes a method of forming air gaps in a semiconductor device. US patent application 2006/0258077 describes a method of forming via air gaps in a semiconductor substrate.

A problem with using air gaps in ILD layers is that the side surfaces and top surfaces of the interconnect lines are exposed to the ambient environment such that during subsequent process steps, contaminant material, such as etch gases or Chemical Mechanical Polishing (CMP) slurry, can seep through the porous ILD layers and enter the air gaps and attack the unprotected metal interconnect lines.

Some techniques for sealing the air gaps have been proposed. For example, U.S. Pat. No. 6,297,125 describes depositing a 50-100 nm layer of silicon dioxide over the metal lines to protect the metal, etching a sacrificial dielectric layer between the metal lines of the same interconnect level to the protection layer of silicon dioxide to form air gaps and then using thick (500-1000 nm) dielectric layers formed of Plasma-Enhanced TetraEthylOrthoSilicate (TEOS) oxide to enclose the top and bottom of the metal lines and the air gap structure. However, TEOS has a high dielectric constant and so such a sealing layer would negatively impact the speed of signal propagation in the IC. Furthermore, the etchants used to etch the sacrificial dielectric layer to form the air gaps is typically aggressive to all dielectric layers and therefore the protection layer of silicon dioxide has to be thick (50-100 nm) and has a high dielectric constant k.

US patent application no. 2006/0258077 also describes using a TEOS oxide layer to seal the air gaps.

U.S. Pat. No. 7,078,352 discloses forming air gaps and forming a thick passivation layer over the metal lines.

An article entitled "Dual Damascene Process for Air-Gap Cu Interconnects Using Conventional CVD Films as Sacrificial Layers" by Shouichi Uno, Junji Noguchi, Hiroshi Ashihara, Takayuki Oshima, Kiyohiko Sato, Nobuhiro Konishi, Tatsuyuki Saito and Kazusato Hara, Interconnect Technology Conference, 2005, Proceedings of the IEEE 2005 International, 6-8 Jun. 2005, pages 174-176 describes forming an air gap between metal lines of the same interconnect level and then forming a barrier SiCN film on the metal lines in the air gap.

However, none of the known techniques provide adequate and reliable sealing of the air gaps and ILD layers to avoid corrosion or contamination or erosion of the interconnect lines whilst not impacting negatively the speed of signal propagation in the IC.

SUMMARY

The present invention provides a method of sealing an air gap in a layer of a semiconductor structure and a semiconductor structure as described in the accompanying claims.

BRIEF DESCRIPTION OF THE DRAWINGS

A method of sealing an air gap in a layer of a semiconductor structure in accordance with the present disclosure and a semiconductor structure in accordance with the present disclosure will now be described, by way of example only, with reference to the accompanying drawings in which.

Figure 1:
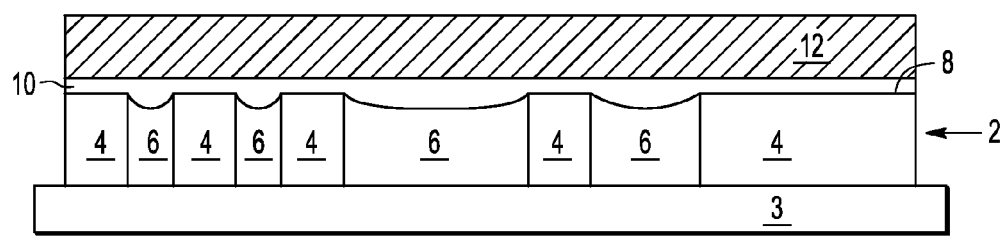
FIG. 1 is a schematic cross-section diagram of a portion of a partially fabricated semiconductor structure in accordance with an embodiment of the disclosure.

Elements in the figures are illustrated for simplicity and clarity and have not necessarily been drawn to scale.

DETAILED DESCRIPTION OF THE DRAWINGS

Methods of sealing an air gap in a layer of a semiconductor structure in accordance with embodiments of the disclosure will now be described with reference to FIGS. 1-6. The methods in accordance with the disclosure can be used to form an interconnect structure in the Back End processing during the manufacture of any IC or semiconductor device. Like elements will be referred to by the same reference numeral in each of the FIGs.

FIG. 1 shows part of a partially fabricated semiconductor structure in accordance with an embodiment of the disclosure having a first layer 2 formed over the partially fabricated semiconductor structure and over an ILD layer 3. Conductive lines or interconnect lines 4, which are typically metal lines such as copper or aluminium lines, are formed in the first layer 2 according to conventional techniques. The conductive lines 4 provide the interconnect lines for a semiconductor structure and electrically connect to the active parts (not shown) of the semiconductor structure. For example, the first layer 2 may be formed from a dielectric material having a low dielectric constant, such as Black Diamond material BD1 and BD2 supplied by Applied Materials. The dielectric constant of such a material is in the range of 2-3. The effective dielectric constant of the first layer 2 is reduced so as to reduce the interconnect capacitance by forming air gaps 6 in the first layer 2. In other words, the material which is used to form the first layer 2 is made porous. Porosity is a measure of the void spaces in a material and is measured as a fraction between 0 and 1 or as a percentage between 0 and 100%. In carbon doped oxides, such as BD2, the porosity can vary between 0 and 60%. For materials with one carbon atom in a basic group, porosity of 20% would correspond to a relative dielectric constant of 2.5 and an extreme porosity of 60% would correspond to a relative dielectric constant of 1.8. However, a porosity of 60% is currently difficult to achieve in practice.

The air gaps 6 may be formed by conventional techniques. For example, by etching a sacrificial dielectric material (e.g. silicon dioxide based material, or low k material such as BD1 or BD2 from Applied Materials) using for example hydrogen fluoride such that the air gaps 6 are formed in the first layer 2 extending into the first layer 2 from a first surface 8 of the first layer 2.

In order to reduce the interconnect capacitance in the first layer 2 to a minimum, air gaps 6 would ideally be used throughout the first layer 2. However, since several layers of interconnect conductive lines 4 are typically used in a semiconductor device or IC, such layers need support and so as a compromise a larger concentration of air gaps 6 is used in the first layer 2 where there is a high density of conductive lines 4 compared to elsewhere in the first layer 2 where the density of conductive lines 4 is less.

A barrier layer 10 of a barrier dielectric material is then formed over the first surface of the first layer 2 and the air gaps 6. The barrier dielectric material is selected to have a dielectric constant which is less than 3.5 and in an embodiment in the range of 2.5-3.5 and to provide a barrier to protect the at least two conductive lines from chemicals (i.e. liquids or gases) which would otherwise enter the at least one air gap and adversely affect the at least two conductive lines. For example, the barrier layer 10 prevents chemicals from contaminating, etching or otherwise damaging the conductive lines. In the embodiment shown in FIG. 1, the barrier layer 10 is formed on the first layer 2 such that the barrier layer 10 closes the air gaps 6. A process with very poor conformality, such as Chemical Vapour Deposition (CVD) or spin-on deposition, may be used so that very little of the barrier dielectric material enters the air gaps 6 (due to their width) but portions of the barrier layer 10 fill or plug the air gaps 6 so as to close the air gaps. The barrier layer 16 also seals the air gaps by preventing contaminants from passing through the barrier layer 16 and entering the air gaps 6. A second ILD layer 12 is then formed over the barrier layer 10. The ILD layers 3 and 12 provide isolation for the metal lines 4 in the vertical direction, that is between further layers having conductive lines formed over the first layer 2 and the air gaps 6 in the first layer 2 provide isolation between the conductive lines 4 in the first layer 2. One or more additional layers with air gaps 6 and conductive lines 4 may then be formed over the second ILD layer 12 and the air gaps of such additional layers will be sealed using a barrier layer 10 as shown in FIG. 1.

In an alternative embodiment (shown in FIG. 2), a dielectric layer 14 is formed on the first surface 8 of the first layer 2 such that the dielectric layer 14 closes the air gaps 6, and the barrier layer 16 is formed on the dielectric layer 14. The barrier layer 16 may be formed by a CVD process or an Atomic Layer Deposition (ALD) process. The dielectric layer 14 is formed by a dielectric material with a low dielectric constant, such as BD1 or BD2. For example, the dielectric layer 14 is formed by non-conformal deposition process so that very little of the dielectric layer 14 enters the air gaps 6 but portions of the dielectric layer 14 fill or plug the air gaps 6 so as to close the air gaps. The barrier layer 16 seals the air gaps and protects the at least two conductive lines from chemicals (i.e. liquids or gases) which would otherwise enter the at least one air gap and adversely affect the at least two conductive lines. For example, the barrier layer 16 prevents chemicals from contaminating, etching or otherwise damaging the conductive lines. A second ILD layer 18 is then formed over the barrier layer 16. One or more additional layers with air gaps 6 and conductive lines 4 may then be formed over the second ILD layer 18 and the air gaps of such additional layers will be sealed using a barrier layer 16 as shown in FIG. 1.

Figure 2:
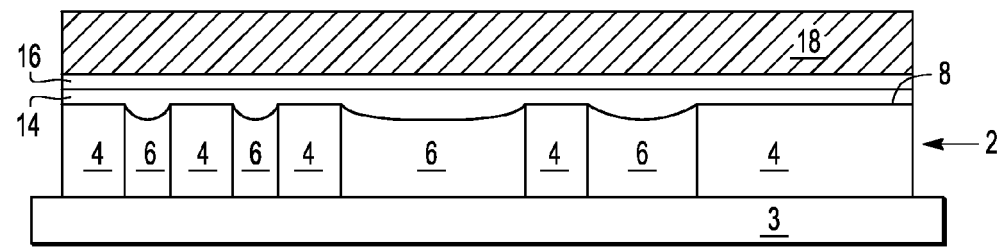
FIG. 2 is a schematic cross-section diagram of a portion of a partially fabricated semiconductor structure in accordance with another embodiment of the disclosure.

In the embodiments shown in FIGS. 1 and 2, the barrier layer has a small thickness in the range of 1-10 nm in order to ensure that the impact of the barrier layer on the interconnect capacitance and hence the speed of signal propagation is kept to a minimum. Since a conformal process can be used to form the barrier layer 16 in the embodiment shown in FIG. 2, it is easier to form a thin barrier layer for this embodiment compared to the embodiment shown in FIG. 1 which uses a non-conformal process to form the barrier layer 10.

The barrier material is a non-porous (that is with a porosity of zero or substantially zero) or dense material and may be selected from one or more of the following: fluorine doped silicon dioxide, carbon doped silicon dioxide, organic polymeric dielectrics silicon nitride, silicon oxide, parylene, amorphous carbon, hydrogenated carbon (a-H:C), fluorinated amorphous carbon (a-F:C), silicon carbide (SiC). For example, a parylene called AF-4 has recently been produced by Advanced Coating having a dielectric constant in the range 2.2 to 2.3. It deposits as a conformal film and is a low-K polymer that is stable up to 450.degree. C.

The ILD layers 3, 12, 18 are formed by dielectric materials having a low dielectric constant such as BD1, BD2 supplied by Applied Materials or other materials from other suppliers.

Figure 3:
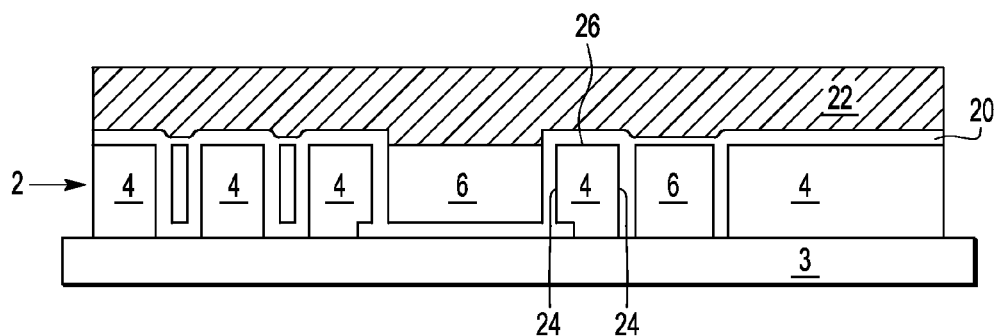
FIG. 3 is a schematic cross-section diagram of a portion of a partially fabricated semiconductor structure in accordance with another embodiment of the disclosure.

Referring now to FIG. 3, another embodiment of the disclosure forms a second barrier layer 20 on the side surfaces 24 and at least a top surface 26 of each of the conductive lines 4. The second barrier layer 20 is formed by a dielectric material having a low dielectric constant, which is less than 3.5 and in an embodiment in the range of 2.5-3.5, to provide a barrier to prevent chemicals damaging the conductive lines 4. The second barrier layer 20 may be deposited by a conformal process such as ALD or Chemical Vapour Deposition (CVD) or may be formed by a reaction between a reactive gas and the surface of the conductive lines 4 so that all the metals surfaces in the air gaps are passivated. The second barrier layer 20 may be formed prior to or after the formation of the air gaps 6. In order to ensure that the impact of the barrier layer 20 on the interconnect capacitance and hence the speed of signal propagation is kept to a minimum, the second barrier layer 20 is a thin layer having a thickness in the range of 1-10 nm.

The embodiment shown in FIG. 3 may be used alone or in combination with the embodiment shown in FIG. 1 or 2.

The embodiment shown in FIG. 3 has particular advantages in interconnect structures comprising multiple layers of interconnect lines. This will be described in more detail below with further reference to FIGS. 4, 5 and 6.

Figure 4:
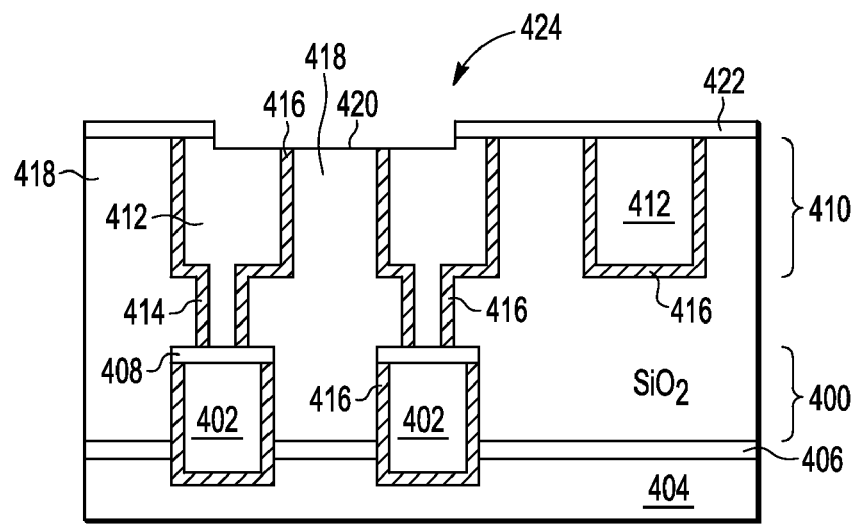
FIGS. 4-6 are schematic cross-section diagrams of a portion of a semiconductor structure having multiple layers of interconnect lines during different stages of fabrication using the method of sealing an air gap in accordance with another embodiment of the disclosure.

FIG. 4 shows a portion of a partially fabricated semiconductor structure having multiple layers of interconnect lines which are formed in a conventional manner such as the methods disclosed in the Interconnect Chapter in the International Technology Roadmap for Semiconductors (ITRS), 2007 Version at http://www.itrs.net/Links/2007ITRS/Home2007.htm or in Interconnect Technology and Design for Gigascale Integration by Jeffrey A Davis, James D Meindl, Kluwer Academic Publishers 2003 or VLSI Handbook by Wai-Kai Chen, CRC Press.

A first layer 400 of conductive lines 402 are formed on an ILD layer 404. ILD layer 404 may be formed from a dielectric material having a low dielectric constant such as BD1 or BD2. Layer 406 is an etch stop layer and allows the processing of the dielectric layers above it without affecting the dielectric layers below it. A cap layer 408 is formed on the top surface of the conductive lines 402. The cap layer 408 is typically called a Self Aligned Barrier (SAB) and its purpose is to prevent migration (known as electromigration) of the metal atoms from the conductive lines 412. A second layer 410 of conductive lines 412 is formed on the first layer 400. The conductive lines 412 of the second layer 410 are electrically connected to the conductive lines 402 of the first layer 400 by vias 414 filled with conductive material such as copper or aluminium. The conductive lines 402 and 412 provide the interconnect lines for the semiconductor structure and electrically connect to the active parts (not shown) of the semiconductor structure. A conductive layer 416 is formed around the conductive lines 402 and 412 and the vias 414 so as to provide a barrier layer to prevent diffusion of the metal atoms from the conductive lines 402 and 412 which would be detrimental to the performance of the semiconductor structure. The conductive layer 416 is typically a bi-layer comprising a tantalum (Ta) layer formed on the conductive lines 402 and 412 and a tantalum nitride (TaN) layer formed on the Ta layer. A sacrificial layer 418 of dielectric material, such as silicon oxide, is formed in the spaces between the conductive lines 402 and 412 and the vias 414. The sacrificial layer 418 and the conductive lines 412 of the second layer 410 extend to a first surface 420. A masking layer 422 is formed on the first surface 420 and is patterned and etched to include openings 424 extending through the masking layer 422 to the first surface 420. The openings are positioned in parts of the semiconductor structure where it is desired to have air gaps between the conductive lines. For example, in the areas of the semiconductor structure where there is a high density of conductive lines.

Figure 5:
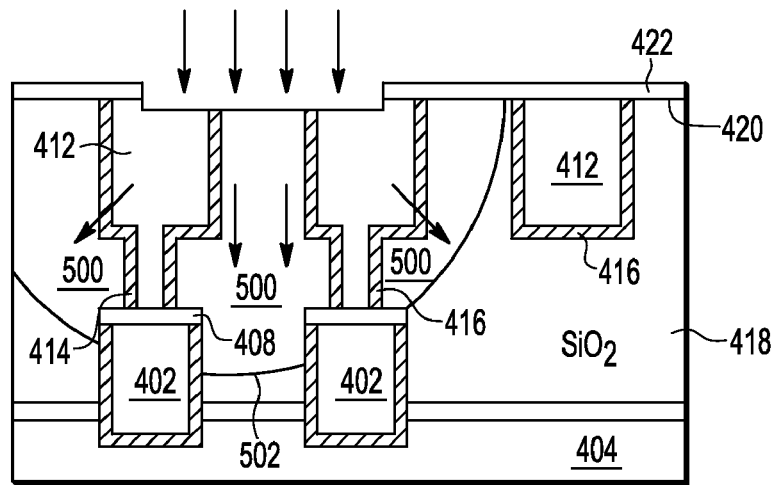

The sacrificial layer 418 is then etched, for example using hydrogen-fluoride as the etchant, so as to form air gaps 500 as shown in FIG. 5. The air gaps 500 extend around a portion of the conductive lines 402 and around the conductive lines 412 so as to expose portions of the side surfaces of the conductive lines 402, and the side surfaces of the conductive lines 412. The air gaps 500 are defined by exposed surfaces 502 of the sacrificial layer 418.

Figure 6:
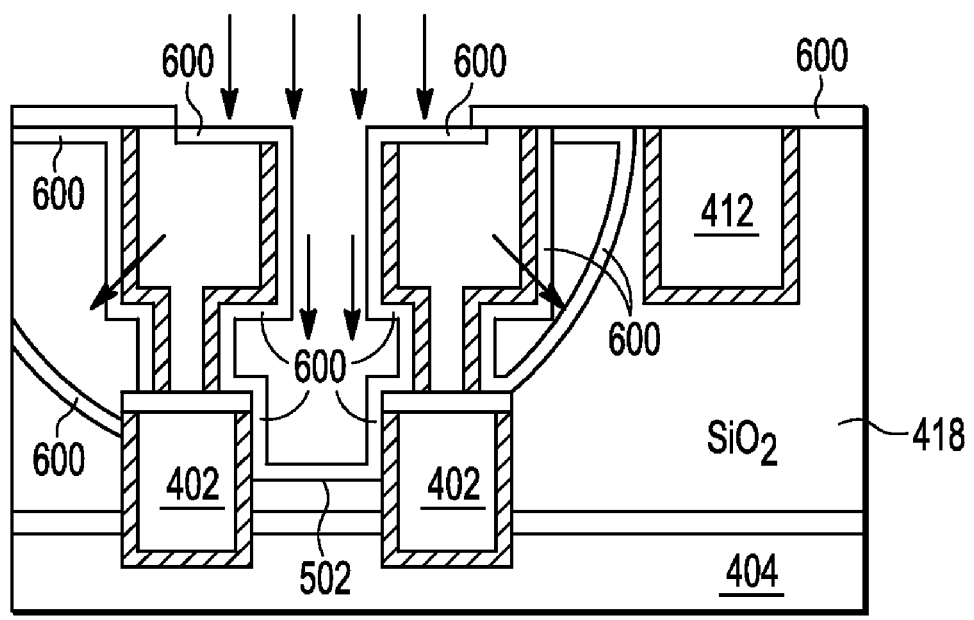

Referring now to FIG. 6, a barrier layer 600 of a barrier dielectric material is then formed on the exposed side surfaces of each of the conductive lines 402, 412 and the exposed top surface of the conductive lines 412. The barrier layer 600 may be formed by a conformal process such as CVD or ALD and has a thickness in the range of 1-10 nm. The barrier dielectric material is selected to be a non-porous material and to have a low dielectric constant which is less than 3.5 and in an embodiment in the range 2.5-3.5 and to provide a barrier to protect the conductive lines 402, 412 from chemicals (i.e. liquids or gases) which may otherwise adversely affect the conductive lines 402, 412. For example, the barrier layer 600 prevents chemicals from contaminating, etching or otherwise damaging the conductive lines. The barrier dielectric material may be one of the following materials: fluorine doped silicon dioxide, carbon doped silicon dioxide, organic polymeric dielectrics silicon nitride, silicon oxide, parylene, amorphous carbon, hydrogenated carbon (a-H:C), fluorinated amorphous carbon (a-F:C)n, silicon carbide (SiC).

In the embodiment shown in FIG. 6, the barrier layer 600 is also formed over the exposed surfaces 502 of the sacrificial layer 418. Since the sacrificial layer 418 is formed by a silicon oxide layer which is porous, by forming a barrier layer 600 over the exposed surfaces of the sacrificial layer 418, the barrier layer 600 can prevent chemicals seeping through the sacrificial layer 418 to the conductive lines 402, 412.

As can be seen in FIG. 6, by depositing the barrier layer 600 through the air gaps 500, the barrier layer 600 can be formed over the vertical and horizontal surfaces of the conductive lines 402, 412 exposed by the air gaps 500 and the surfaces 502 which define the air gaps 500 so as to effectively seal the interfaces of the porous dielectric materials whilst using a barrier material of low dielectric constant so as not to significantly impact the interconnect capacitance. In addition, by forming the air gaps prior to forming the barrier layer 600 over the exposed surfaces in the air gaps, the barrier layer 600 can be thinner than when the barrier layer is formed first, as described in U.S. Pat. No. 6,297,125, since the barrier layer 600 does not have to withstand the formation of the air gaps. Moreover, since the barrier layer 600 is formed after the air gaps have been formed and so does not have to withstand the formation of the air gaps, materials of lower dielectric constant k can be selected for the barrier layer compared to when the barrier layer is formed before the air gaps.

By forming the air gaps 500 and then the barrier layer 600 after the conductive lines are formed, the method of forming a barrier layer in accordance with the disclosure can be applied to any air gaps whether they extend between multiple layers of interconnect lines or just in one layer.

The air gaps 500 may then be sealed by either of the methods described above with reference to FIG. 1 or 2 or by a known method e.g. by using an ILD layer to plug the air gaps.

Although additional, process steps are required to form the barrier layer in accordance with the disclosure, the barrier layer can be formed by CVD or ALD processes which are already used in the Back End processing of semiconductor structures and so the cost of manufacturing of such devices is not increased significantly by the use of a barrier layer in accordance with the disclosure.

Thus, by using a barrier layer which has a low dielectric constant over the first layer and the air gaps so as to provide a barrier to protect the conductive lines from chemicals which may damage the conductive lines, the method of sealing in accordance with the present invention provides a reliable method of sealing the air gaps to avoid corrosion or other damage of the conductive lines during subsequent process steps whilst ensuring the effective dielectric constant is not increased significantly which will have a negative impact on the speed of signal propagation along the conductive lines.

Furthermore, as discussed above, the method in accordance with the disclosure can be easily integrated into the formation of the interconnect structures in the Back End process flow.

In the above description and in FIGS. 1-6, certain regions are identified as being of a particular material, conductivity and/or type. However, this is merely for convenience of explanation and not intended to be limiting. Those of skill in the art will understand based on the description given herein that various semiconductor materials can be used.

In the foregoing specification, the invention has been described with reference to specific examples of embodiments of the invention. It will, however, be evident that various modifications and changes may be made therein without departing from the broader scope of the invention as set forth in the appended claims. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim.

What is claimed is:

1. A semiconductor device structure comprising:
   a first layer having at least one air gap for providing isolation between at least two conductive lines formed in the first layer, the at least one air gap extending into the first layer from a first surface of the first layer;
   a first dielectric layer over the first surface of the first layer, the first dielectric layer closes the at least one air gap;
   a barrier layer of a first barrier dielectric material over the first dielectric layer that is conformal, the barrier layer having a thickness in the range of 1-10 nm, a dielectric constant less than 3.5, and is a barrier that prevents chemicals entering the at least one air gap; and
   a second dielectric layer over the barrier layer having at least one air gap for providing isolation between at least two conductive lines formed in the second dielectric layer.

2. The structure of claim 1, wherein the first barrier dielectric material is a non-porous material.

3. The structure of claim 1, wherein the first barrier dielectric material is one of the following:
   fluorine doped silicon dioxide;
   carbon doped silicon dioxide;
   organic polymeric dielectrics;
   parylene;
   amorphous carbon;
   hydrogenated carbon (a-H:C);
   fluorinated amorphous carbon (a-F:C)n.

4. The structure of claim 1, wherein the at least one air gap of the first layer extends to the at least two conductive lines to expose surfaces of the at least two conductive lines formed in the first layer, the structure further comprising a second barrier layer of a second barrier dielectric material over the exposed surfaces of each of the at least two conductive lines.

5. The structure of claim 4, wherein the second barrier dielectric material has a dielectric constant less than 3.5 and provides a barrier to prevent chemicals contacting the at least two conductive lines.

6. The structure of claim 4, wherein the second barrier dielectric material is a non-porous material.

7. The structure of claim 4, wherein the second barrier layer has a thickness in the range of 1-10 nm.

8. A semiconductor device structure comprising:
   a first layer having at least one air gap for providing isolation between at least two conductive lines formed in the first layer, the at least one air gap extending into the first layer from a first surface of the first layer, and extending to the at least two conductive lines to expose surfaces of the at least two conductive lines;
   a first barrier layer of a first barrier dielectric material over the exposed surfaces of each of the at least two conductive lines;
   a dielectric layer over the first surface of the first layer that closes the at least one air gap, the first barrier layer between the at least two conductive lines and the dielectric layer;
   a second barrier layer of a second barrier dielectric material over the dielectric layer that is conformal to the dielectric layer, the second barrier layer having a thickness in the range of 1-10 nm, the second barrier dielectric material having a dielectric constant less than 3.5, wherein the second barrier dielectric material prevents chemicals entering the at least one air gap; and
   wherein the first barrier dielectric material is one of the following:
   fluorine doped silicon dioxide;
   carbon doped silicon dioxide;
   organic polymeric dielectrics;
   parylene;
   amorphous carbon;
   hydrogenated carbon (a-H:C);
   fluorinated amorphous carbon (a-F:C)n.

9. A semiconductor device structure comprising:
   a first layer of the semiconductor device structure having at least one air gap that isolates at least two conductive lines formed in the first layer, the at least one air gap extending into the first layer from a first surface of the first layer, and extending to the at least two conductive lines to expose surfaces of the at least two conductive lines;
   a first barrier layer of a first barrier dielectric material over the exposed surfaces of each of the at least two conductive lines;
   a dielectric layer on the first surface of the first layer such that the dielectric layer closes the at least one air gap, the first barrier layer between the at least two conductive lines and the dielectric layer; and
   a second barrier layer of a second barrier dielectric material over the dielectric layer that is conformal to the dielectric layer, the second barrier layer having a thickness in the range of 1-10 nm, the second barrier dielectric material being selected to have a dielectric constant less than 3.5 and to provide a barrier that prevents chemicals from entering the at least one air gap,
   wherein the second barrier dielectric material and the first barrier dielectric material are the same.

10. The structure of claim 5, wherein the first layer comprises:
    a second dielectric layer having at the least two conductive lines formed in the first dielectric layer; and
    the at least one air gap being in the second dielectric layer and extending from the first surface of the second dielectric layer into the second dielectric layer and extending to at least a portion of side surfaces of the at least two conductive lines to expose at least portions of the side surfaces, and
    wherein the second barrier layer is conformal to the side surfaces of the at least two conductive lines through the at least one air gap.

11. The structure of claim 10, wherein the at least one air gap is defined by exposed surfaces of the second dielectric layer extending from the first surface and wherein the second barrier layer is on the exposed surfaces of the first dielectric layer.

12. The structure of claim 10, wherein each of the at least two conductive lines have a top surface which is substantially in the same plane as the first surface of the second dielectric layer, wherein a second barrier layer is over at least a portion of the top surfaces of at least one of the at least two conductive lines.

13. The structure of claim 1, wherein the barrier dielectric material is one of the following:
fluorine doped silicon dioxide;
carbon doped silicon dioxide;
organic polymeric dielectrics;
parylene;
amorphous carbon;
hydrogenated carbon (a-H:C);
fluorinated amorphous carbon (a-F:C)n.

14. The structure of claim 1, wherein the at least one air gap extends to the at least two conductive lines to expose surfaces of the at least two conductive lines, the structure further comprising a second barrier layer of a second barrier dielectric material over the exposed surfaces of each of the at least two conductive lines.

15. The structure of claim 5, wherein the second barrier layer has a thickness in the range of 1-10 nm.

16. The structure of claim 1, wherein the second barrier dielectric material is one of the following:
fluorine doped silicon dioxide;
carbon doped silicon dioxide;
organic polymeric dielectrics;
parylene;
amorphous carbon;
hydrogenated carbon (a-H:C);
fluorinated amorphous carbon (a-F:C)n.

17. The structure of claim 9, wherein the first barrier dielectric material has a dielectric constant less than 3.5 and provides a barrier that prevents chemicals contacting the at least two conductive lines.

18. The structure of claim 9, wherein the first barrier dielectric material is a non-porous material.

19. The structure of claim 9, wherein the first barrier layer has a thickness in the range of 1-10 nm.

20. The structure of claim 8, wherein the first barrier dielectric material has a dielectric constant less than 3.5 and provides a barrier that prevents chemicals contacting the at least two conductive lines.

* * * * *